United States Patent [19]
Wang et al.

[11] Patent Number: 6,146,987
[45] Date of Patent: Nov. 14, 2000

[54] METHOD FOR FORMING A CONTACT PLUG OVER AN UNDERLYING METAL LINE USING AN ETCHING STOP LAYER

[75] Inventors: Chien-chun Wang, Hsinchu; Eddie Chiu, Chia-Yi; Chung-Yi Chen, Yung-Kang; Hsien-Yuan Chang, Taipei, all of Taiwan

[73] Assignees: ProMOS Tech., Inc.; Mosel Vitelic, Inc., both of Hsinchu, Taiwan; Siemens AG, Muchen, Germany

[21] Appl. No.: 09/383,123

[22] Filed: Aug. 25, 1999

[51] Int. Cl.[7] .................................. H01L 21/4763
[52] U.S. Cl. .................... 438/618; 438/637; 438/624; 438/633; 438/672
[58] Field of Search ..................... 438/634, 637, 438/627, 643, 622, 618, 624, 626, 672, 675, 631, 633, 646, 632, 648, 620, 597, 639

[56] References Cited

U.S. PATENT DOCUMENTS 5,985,747  11/1999  Taguchi ......................... 438/622

*Primary Examiner*—Charles Bowers
*Assistant Examiner*—Hsien Ming Lee
*Attorney, Agent, or Firm*—Blakely, Sokoloff, Taylor, & Zafman

[57] ABSTRACT

A method for forming a contact plug that lands on a metal line of an interconnect structure formed on a semiconductor substrate. First, a first insulating layer is formed atop the substrate and between gaps in the interconnect structure. Next, an etching stop layer is formed on the first insulating layer. A second insulating layer is formed atop the etching stop layer. The second insulating layer is patterned and etched, stopping at the etching stop layer, to form a contact opening. The portion of the etching stop layer left exposed by the contact opening is removed. Finally, a barrier metal layer is formed along the walls of the contact opening and a conducting layer is deposited into the contact opening.

7 Claims, 4 Drawing Sheets

METHOD FOR FORMING A CONTACT PLUG OVER AN UNDERLYING METAL LINE USING AN ETCHING STOP LAYER

FIELD OF THE INVENTION

The present invention relates generally to semiconductor manufacturing processes, and more particularly, to a method for forming a contact plug or via.

BACKGROUND OF THE INVENTION

In semiconductor manufacturing, contact plugs are used to connect conducting layers on two different levels. FIGS. 1 and 2 show cross-sectional views of a semiconductor substrate 101, illustrating the steps of a conventional method for forming a contact plug. The term substrate is understood to possibly include a semiconductor wafer, active and passive devices formed within the wafer, and layers formed on the wafer's surface.

Formed atop of the substrate 101 are metal lines 103. Typically, the metal lines 103 are a composite stack of different materials. The primary sandwiched material is aluminum, copper, or an aluminum-copper alloy. The tops and bottoms of the metal lines 103 may be covered with a barrier layer as is conventional in the art.

Still referring to FIG. 1, an insulating layer 105 is deposited atop the substrate 101 and the metal lines 103. The insulating layer 105 is commonly referred to as an intermetal dielectric. Next, a contact opening 109 is formed by etching through the insulating layer 105 using conventional photolithography techniques using a photoresist layer 107. Note that in FIG. 1, the contact opening 109 does not land squarely atop of the metal line 103. This is a result of misalignment in the photolithography process and is not uncommon, particularly as device geometry is further reduced.

Next, turning to FIG. 2, a barrier metal layer 201 is deposited into the contact opening 109 and atop the insulating layer 105. Typically, the barrier metal layer 201 is a titanium nitride material. Then, a conducting layer 203 is deposited into the contact opening 109 and atop the barrier metal layer 201. The conducting layer 203 is often formed from the chemical vapor deposition (CVD) of tungsten.

To complete the process, the portion of the conducting layer 203 atop the insulating layer 105 and the portion of the barrier metal layer 201 atop the insulating layer 105 are removed by chemical mechanical polishing (CMP). The portion of the conducting layer 203 inside the contact opening 109 remains to form the contact plug.

Note that one result of the misalignment during the photolithography step is that the contact plug extends down the side of the metal line 103 as highlighted by area 205. With the materials described above, the flouride gas from the $WF_6$ used in the deposition process of the conductive layer 203 will attack the aluminum in the metal line 103 if weak spots are present in the titanium nitride barrier metal layer 201. This will reduce the integrity of the contact plug, as well as cause other detrimental effects.

What is needed is an improved method for forming a contact plug without the problems of the prior art noted above.

SUMMARY OF THE INVENTION

A method for forming a contact plug that lands on a metal line of an interconnect structure formed on a semiconductor substrate is disclosed. The method comprises the steps of: forming a first insulating layer atop said substrate and between gaps in said interconnect structure; forming an etching stop layer on said first insulating layer; forming a second insulating layer atop said etching stop layer; patterning and etching said second insulating layer, stopping at said etching stop layer, to form a contact opening; removing that portion of said etching stop layer left exposed by said contact opening; forming a barrier metal layer along the walls of said contact opening; and forming a conducting layer into said contact opening and atop said barrier metal layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In accordance with the present invention, a new method for forming contact plugs is disclosed. Specifically, turning to FIG. 3, a semiconductor substrate 301 is shown. The term substrate is understood to possibly include a semiconductor wafer, active and passive devices formed within the wafer, and layers formed on the wafer's surface.

Formed atop of the substrate 301 are metal lines 303. The metal lines 303 are part of a metal interconnect structure used for carrying electrical signals between devices formed in the substrate 301. Typically, the metal lines 303 are a composite stack of different materials. The primary material is either aluminum, copper, or an aluminum-copper alloy. The tops and bottoms of the metal lines 303 may be covered with a barrier layer as is conventional in the art.

Figure 3:
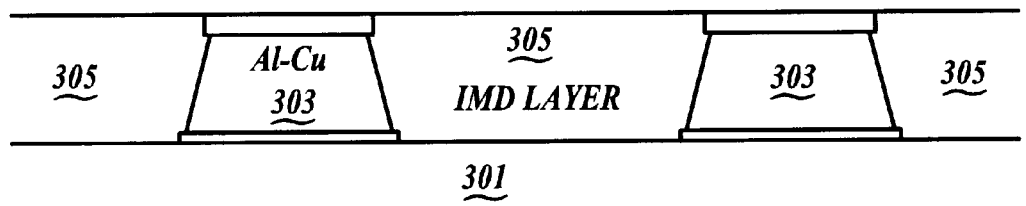
FIGS. 3–7 are cross-sectional views of a semiconductor substrate illustrating the steps of the present invention.

In FIG. 3, an intermetal dielectric layer 305 is formed atop the substrate 301 and between the metal lines 303. This can be done by blanket depositing the intermetal dielectric material over the metal lines 303 and the substrate 301. Next, the intermetal dielectric material may be planarized using a chemical mechanical process (CMP) until the tops of the metal lines 303 are reached. Thus, the gaps between the metal lines 303 are filled with the intermetal dielectric. The intermetal dielectric layer 305 may be formed of silicon oxide, borophosphosilicate glass (BPSG), tetraethylorthosilicate (TEOS) oxide, fluorine doped oxide, or any combination thereof Next, turning to FIG. 4, an etching stop layer 401 is formed over the tops of the metal lines 303 and the intermetal dielectric layer 305. The etching stop layer 401 should be chosen to provide good etching selectivity relative to oxide. For example, a CVD silicon nitride material would be suitable for the etching stop layer. The etching stop layer is preferably on the order of 100-200 angstroms thick.

Figure 4:
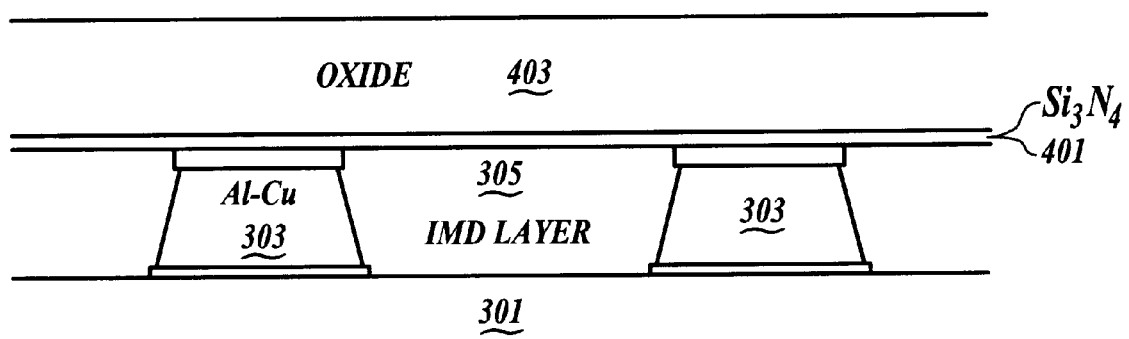

Still referring to FIG. 4, an oxide layer 403 is then formed over the etching stop layer 401. The oxide layer may be a conventional CVD oxide, borophosphosilicate glass (BPSG), tetraethylorthosilicate (TEOS) oxide, fluorine doped oxide, or any combination thereof. Preferably, the thickness of the oxide layer 403 may be between 1000 and 5000 angstroms.

Figure 1:
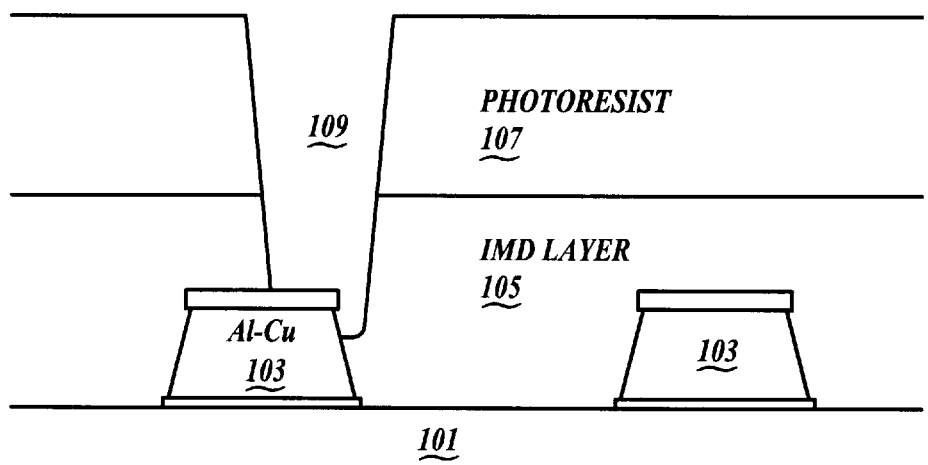
FIGS. 1 and 2 are cross-sectional views of a semiconductor substrate illustrating the steps of a conventional method for forming a contact plug.
Figure 2:
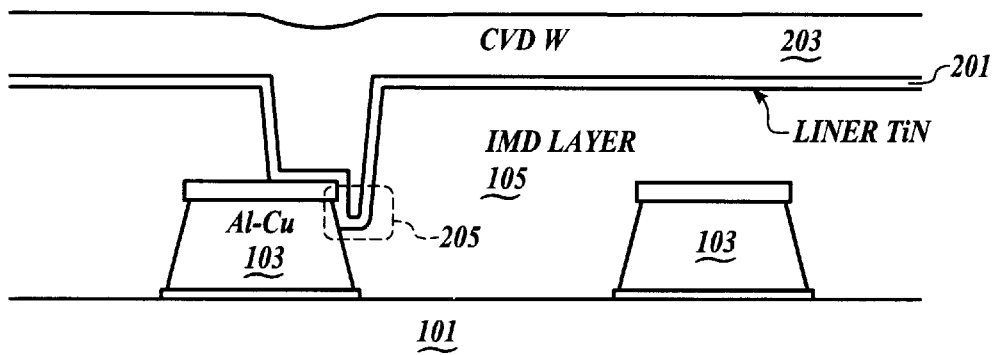
Figure 5:
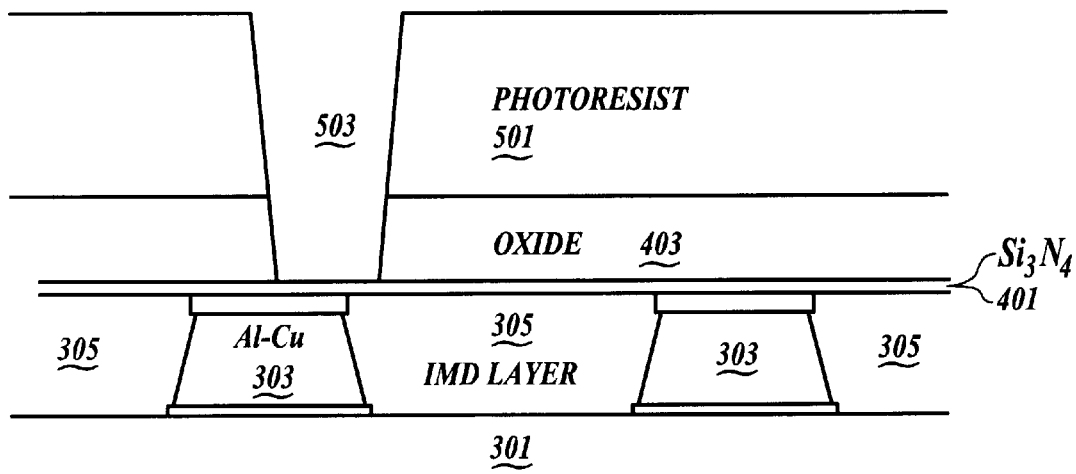

Turning to FIG. 5, a contact opening 503 is formed in the oxide layer 403. The contact opening 503 is formed using a photoresist layer 501 as a mask. Note that, like the prior art shown in FIGS. 1 and 2, the contact opening 503 is misaligned to the top of the metal line 303. However, because of the presence of the etching stop layer 401, the etching of the oxide layer 403 does not extend down past the top of the metal line 303. Because of the high etching selectivity of oxide to nitride, the nitride layer 401 acts as an effective etching stop layer.

Figure 6:
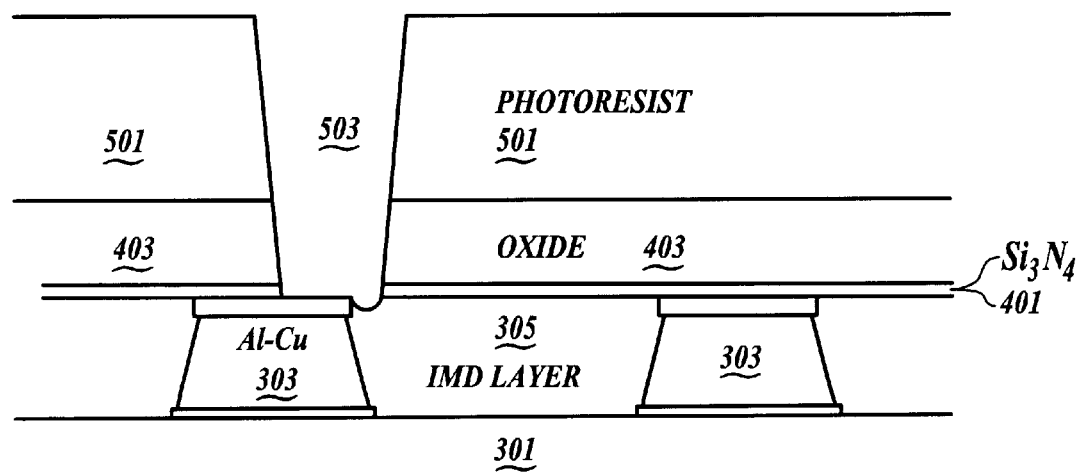

Next, turning to FIG. 6, a new etching recipe is used to remove the exposed silicon nitride material at the bottom of the contact opening 503. Once again, because of the high etching selectivity of nitride to oxide in the new etching recipe, only the nitride layer is removed, while the inter-metal dielectric layer 305 is left relatively undamaged.

Figure 7:
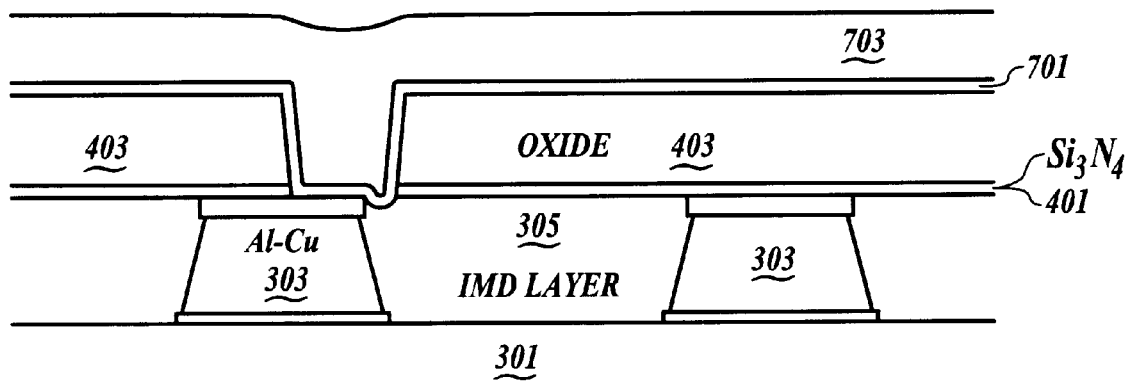

Next, turning to FIG. 7, the photoresist layer 501 is removed and a barrier metal layer 701 is deposited along the walls of the contact opening 503 and atop the metal line 303 and the oxide layer 403. The barrier metal layer 701 is preferably formed of Ti, TiN, Ta, TiW, or WN. The barrier metal layer 701 is preferably about 100-500 angstroms thick. Next, a conducting layer 703 is deposited into the contact opening 503 and atop the barrier metal layer 701. The conducting layer 703 is preferably formed of tungsten.

Finally, the portion of the conducting layer 703 and the barrier metal layer 701 atop the oxide layer 403 is removed by CMP or any other conventional method. The remaining conducting layer in the contact opening 503 thus forms a contact plug.

Note importantly that the use of the etching stop layer 401 prevents any contact between the aluminum in the metal line 303 from contact with the barrier layer 701. Thus, even if weak spots in the barrier layer 701 were to exist, the tungsten in the conducting layer 703 would not be in contact with the aluminum of the metal lines 303.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a contact plug that lands on a metal line of an interconnect structure formed on a semiconductor substrate, the method comprising the steps of:

forming a first insulating layer atop said substrate and between gaps in said interconnect structure;

forming an etching stop layer on said first insulating layer and atop said metal lines of said interconnect structure;

forming a second insulating layer atop said etching stop layer;

patterning and etching said second insulating layer, stopping at said etching stop layer, to form a contact opening;

removing a portion of said etching stop layer left exposed by said contact opening;

forming a barrier metal layer along the walls of said contact opening; and forming a conducting layer into said contact opening and atop said barrier metal layer.

2. The method of claim 1 wherein said first insulating layer leaves the top of said metal line exposed.

3. The method of claim 1 wherein said first and second insulating layers are oxides and said etching stop layer is a nitride.

4. The method of claim 1 wherein said conducting layer is tungsten.

5. The method of claim 1 wherein said barrier metal layer is formed of Ti, TiN, Ta, TiW or WN.

6. The method of claim 1 wherein said barrier metal layer is about 100–500 angstroms thick.

7. The method of claim 1 wherein the step of forming said barrier metal layer and said conducting layer comprises:

depositing a barrier metal layer into said contact opening and over said second insulating layer;

depositing a conducting layer over said barrier metal layer; and performing a chemical mechanical polishing step to removed said barrier metal layer and said conducting layer not within said contact opening.

* * * * *